(12) United States Patent
Wang et al.

(10) Patent No.: US 7,923,745 B2
(45) Date of Patent: Apr. 12, 2011

(54) LED CHIP PACKAGE STRUCTURE WITH HIGH-EFFICIENCY LIGHT-EMITTING EFFECT AND METHOD OF PACKAGING THE SAME

(75) Inventors: Bily Wang, Hsinchu (TW); Jonnie Chuang, Taipei County (TW); Wen-Kuei Wu, Hsinchu County (TW)

(73) Assignee: Harvatek Corporation, Hsinchu (TW)

( * ) Notice: Subject to any disclaimer, the term of this patent is extended or adjusted under 35 U.S.C. 154(b) by 841 days.

(21) Appl. No.: 11/779,556

(22) Filed: Jul. 18, 2007

(65) Prior Publication Data

US 2009/0020770 A1    Jan. 22, 2009

(51) Int. Cl.
*H01L 33/00* (2010.01)

(52) U.S. Cl. ............. 257/99; 257/88; 257/90; 257/91; 257/98; 257/E21.499; 257/E33.057; 257/E33.066; 438/26; 438/27; 438/28

(58) Field of Classification Search ............ 257/88, 257/90, 91, 98, 99, E21.499, E33.057, E33.066; 438/26, 27, 28
See application file for complete search history.

(56) References Cited

U.S. PATENT DOCUMENTS

2008/0258169 A1* 10/2008 Masuko .................. 257/99
2009/0231833 A1*  9/2009 Miki et al. ............... 362/84

\* cited by examiner

*Primary Examiner* — Dao H Nguyen
(74) *Attorney, Agent, or Firm* — Rosenberg, Klein & Lee

(57) ABSTRACT

An LED chip package structure with high-efficiency light-emitting effect includes a substrate unit, a light-emitting unit, and a package colloid unit. The substrate unit has a substrate body, and a positive electrode trace and a negative electrode trace respectively formed on the substrate body. The light-emitting unit has a plurality of LED chips arranged on the substrate body, and each LED chip has a positive electrode side and a negative electrode side respectively and electrically connected with the positive electrode trace and the negative electrode trace of the substrate unit. The package colloid unit has a plurality of package colloids respectively covered on the LED chips.

10 Claims, 15 Drawing Sheets

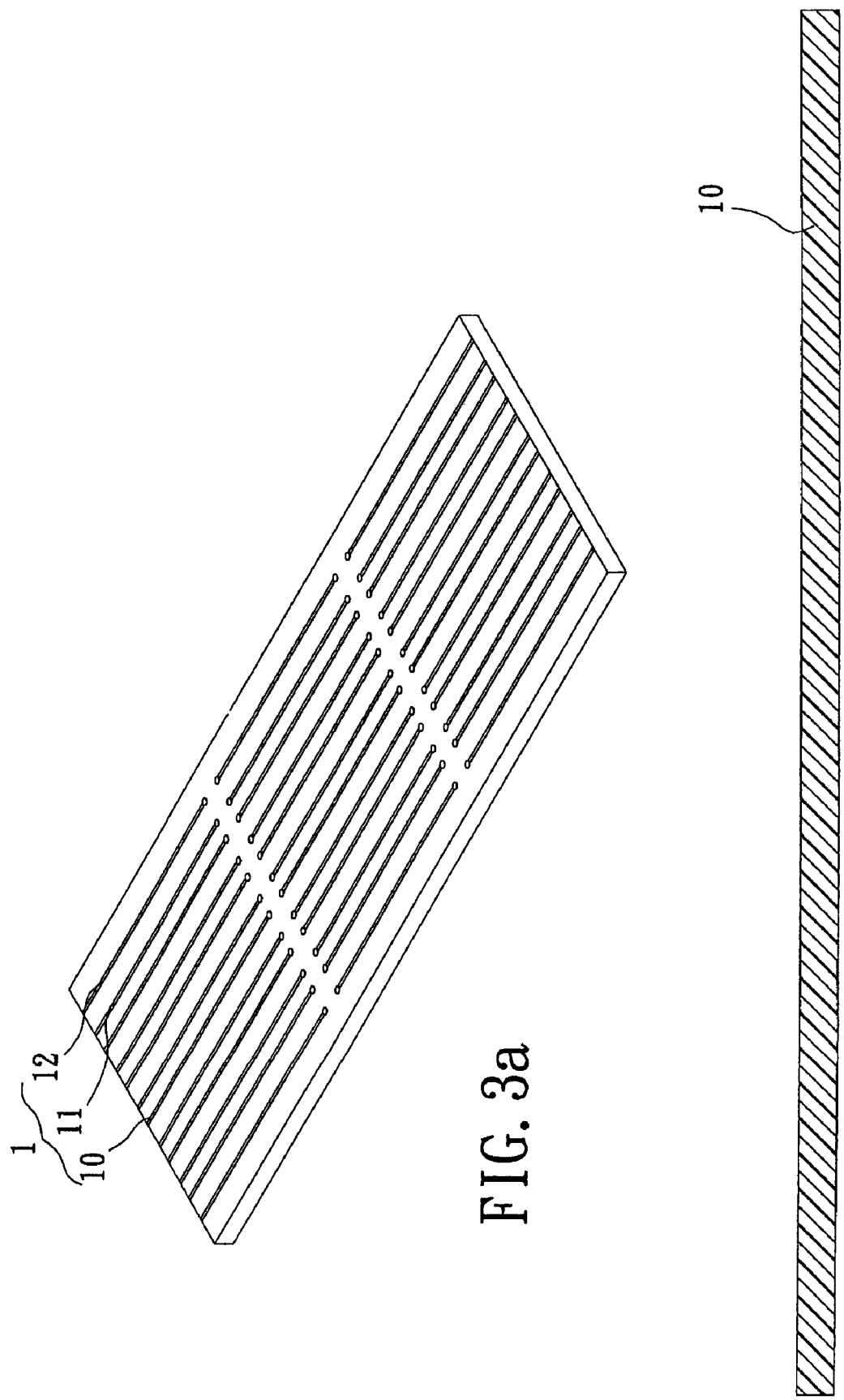

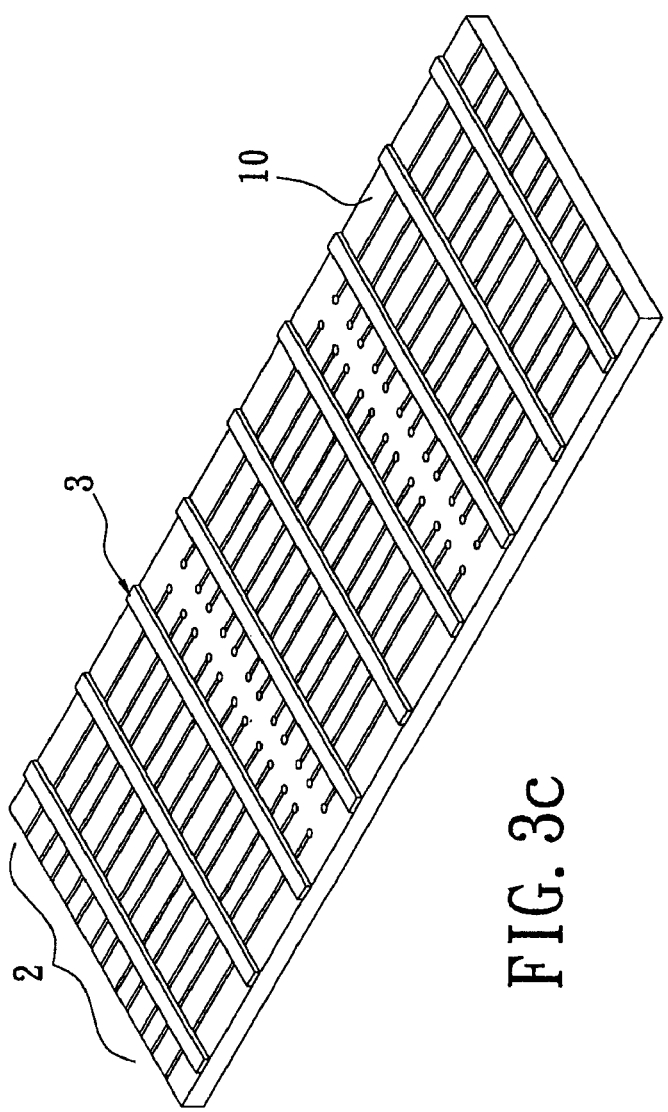
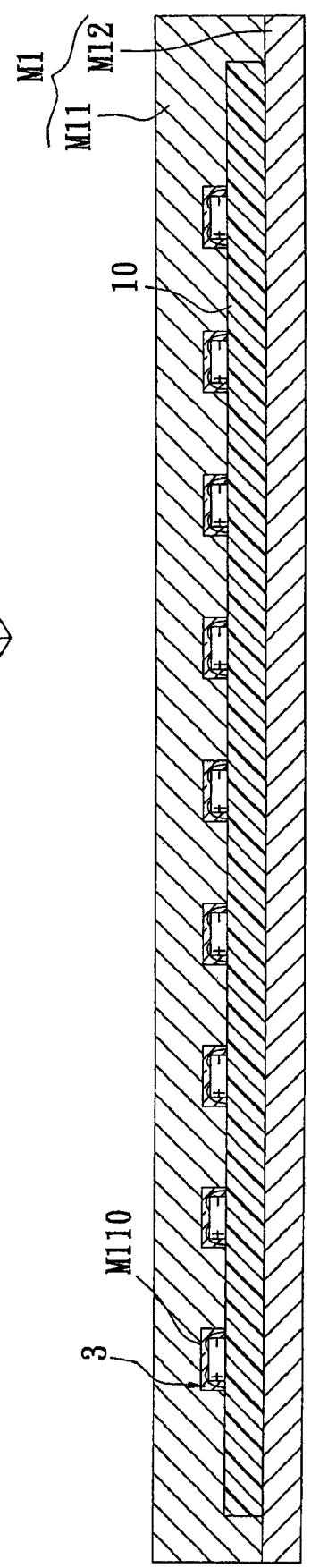
FIG. 3c
FIG. 3C

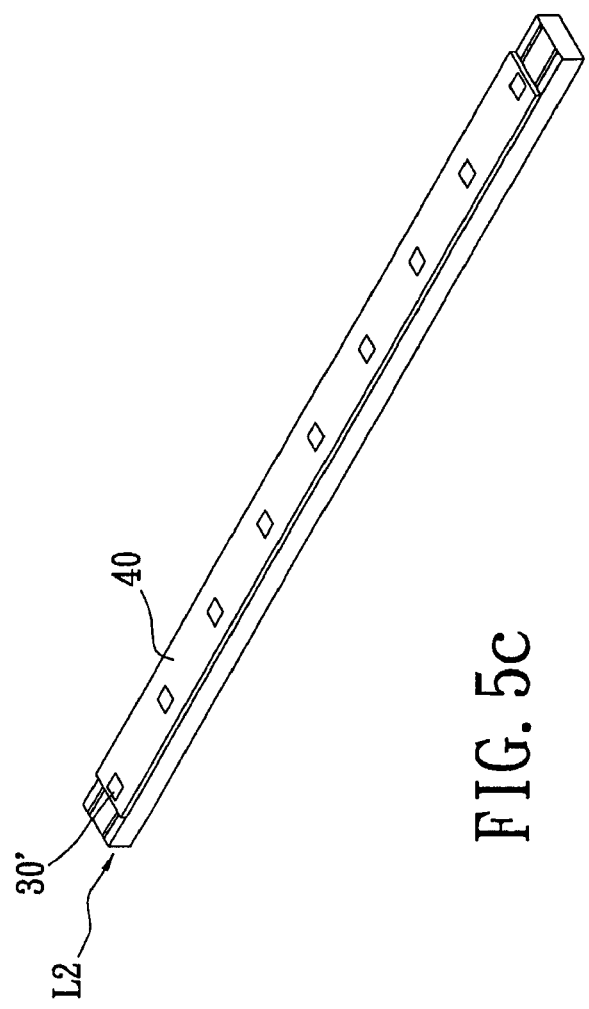
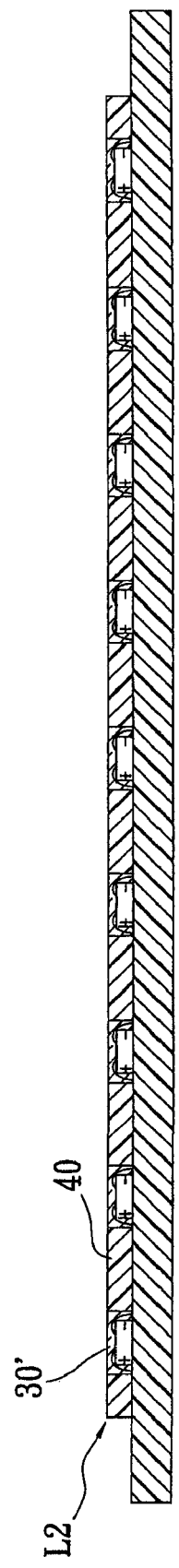
FIG. 5c
FIG. 5C

LED CHIP PACKAGE STRUCTURE WITH HIGH-EFFICIENCY LIGHT-EMITTING EFFECT AND METHOD OF PACKAGING THE SAME

BACKGROUND OF THE INVENTION

1. Field of the Invention

The present invention relates to an LED chip package structure and a method of packaging the same, and particularly relates to a light socket structure for an LED chip package structure which emits light highly efficiently and a method of packaging the same.

2. Description of the Related Art

Referring to FIG. 1, a known first method for packaging LED chips is shown. The known first method includes: providing a plurality of packaged LEDs that have been packaged (S800); providing a stripped substrate body that has a positive electrode trace and a negative electrode trace (S802); and then, arranging each packaged LED on the stripped substrate body in sequence and electrically connecting a positive electrode side and a negative electrode side of each packaged LED with the positive electrode trace and the negative electrode trace of the substrate body (S804).

Referring to FIG. 2, a known second method for packaging LED chips is shown. The known second method includes: providing a stripped substrate body that has a positive electrode trace and a negative electrode trace (S900); arranging a plurality of LED chips on the stripped substrate body in sequence and electrically connecting a positive electrode side and a negative electrode side of each LED chip with the positive electrode trace and the negative electrode trace of the substrate body (S902); and then, covering a stripped package colloid on the substrate body and the LED chips to form a light bar with a stripped light-emitting area (S904).

However, with regard to the known first method, each packaged LED needs to be firstly cut from an entire LED package structure, and then each packaged LED is arranged on the stripped substrate body via SMT process. Hence, the known first packaging process is time-consuming. Moreover, because the fluorescent colloids are separated from each other, a dark band is easily produced between the two fluorescent colloids and the two LEDs. Hence, the known LED package structure does not offer a good display for users. Moreover, because the package colloids of the packaged LEDs are separated from each other, a dark band is easily produced between each two package colloids and each two packaged LEDs. Hence, the known first LED package structure does not offer a good display for users.

With regard to the known second method, because the light bar produces the stripped light-emitting area, no dark band is produced. However, the triggered area of the stripped package colloid is not uniform, so the light-emitting efficiency of the light bar is not good. In other words, one partial package area of the stripped package colloid close to the LED chips generates a stronger triggered light, and the other partial package area of the stripped package colloid separated from the LED chips generates a weaker triggered light.

SUMMARY OF THE INVENTION

The present invention provides an LED chip package structure and a method of packaging the same. When the LED chip package structure of the present invention lights up, the LED chip package structure generates a series of light-generating areas on a colloid unit. Because the series of light-generating areas is continuous, no dark bands are produced between each two LED chips. Furthermore, because the LED chips are arranged on a substrate body via an adhesive or a hot pressing method, the process for the LED chip package structure is simple and less time is needed for the manufacturing process. Furthermore, the LED chip package structure can be applied to any type of light source such as a back light module, a decorative lamp, a lighting lamp, or a scanner.

A first aspect of the present invention is a method of packaging LED chips with high-efficiency light-emitting effect. The method includes: providing a substrate unit, the substrate unit having a substrate body, and a positive electrode trace and a negative electrode trace being respectively formed on the substrate body; arranging a plurality of LED chips on the substrate body via a matrix method to form a plurality of longitudinal LED chip rows, each LED chip having a positive electrode side and a negative electrode side respectively and electrically connected with the positive electrode trace and the negative electrode trace of the substrate unit; then longitudinally and respectively covering a plurality of stripped package colloids on the longitudinal LED chip rows via a first mold unit.

Moreover, the method further comprise three packaging processes, which can be described as follows:

The first packaging process includes: transversely cutting the stripped package colloids and the substrate body along a line between each two adjacent and longitudinal LED chips to form a plurality of light bars, wherein each light bar has a plurality of package colloids that are separated from each other and respectively covered on the corresponding LED chips.

The second packaging process includes: transversely cutting the stripped package colloids along a line between each two adjacent and longitudinal LED chips to form a plurality of package colloids that are separated from each other and respectively covered on the corresponding LED chips; respectively covering and filling a frame unit on the substrate body between each two adjacent package colloids via a second mold unit; and transversely cutting the frame unit and the substrate body along a line between each two adjacent and longitudinal LED chips to form a plurality of light bars, each light bar having a frame layer covered around whole lateral sides of each package colloid.

The third packaging process includes: transversely cutting the stripped package colloids along a line between each two adjacent and longitudinal LED chips to form a plurality of package colloids that are separated from each other and respectively covered on the corresponding LED chips; respectively covering and filling a plurality of stripped frame layers on the substrate body between each two longitudinal and adjacent package colloids via a third mold unit; and transversely cutting the stripped frame layers and the substrate body along a line between each two adjacent and longitudinal LED chips to form a plurality of light bars, wherein each light bar has a plurality of frame bodies, and each frame body is covered around whole lateral sides of each corresponding package colloid.

A second aspect of the present invention is an LED chip package structure with high-efficiency light-emitting effect. The LED chip package structure includes a substrate unit, a light-emitting unit, and a package colloid unit.

The substrate unit has a substrate body, and a positive electrode trace and a negative electrode trace respectively formed on the substrate body. The light-emitting unit has a plurality of LED chips arranged on the substrate body, and each LED chip has a positive electrode side and a negative electrode side respectively and electrically connected with the positive electrode trace and the negative electrode trace of the substrate unit. The package colloid unit has a plurality of package colloids respectively covered on the LED chips.

Moreover, the LED chip package structure further comprises two detailed structures, as follows:

The first detailed structure includes: a frame unit that is a frame layer covered on the substrate body and disposed around whole lateral sides of each package colloid for exposing a top surface of each package colloid.

The second detailed structure includes: a frame unit that has a plurality of frame bodies. Each frame body is covered on the substrate body and is disposed around whole lateral sides of each corresponding package colloid for exposing a top surface of each package colloid, the frame bodies are separated from each other.

Therefore, because the series of light-generating areas are continuous, no dark bands are produced between each two LED chips. Furthermore, because the LED chips are arranged on the substrate body via an adhesive or a hot pressing method, the process of the present invention is simple and so reduces the required manufacturing time.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawings, in which:

FIGS. 3a to 3d are perspective, schematic diagrams of a packaging process according to the first embodiment of present invention;

FIGS. 3A to 3D are cross-sectional diagrams of a packaging process according to the first embodiment of present invention;

FIGS. 5a to 5c are perspective, schematic diagrams of a packaging process according to the second embodiment of present invention;

FIGS. 5A to 5C are cross-sectional diagrams of a packaging process according to the second embodiment of present invention;

FIGS. 6A to 6B are cross-sectional diagrams of a packaging process according to the third embodiment of present invention.

DETAILED DESCRIPTION OF PREFERRED BEST MOLDS

Referring to FIGS. 3, 3a to 3d, and 3A to 3D, the first embodiment of the present invention provides a method of packaging LED chips package structure with high-efficiency light-emitting effect. The method comprises: referring to FIGS. 3a and 3A, providing a substrate unit 1, the substrate unit having a substrate body 10, and a positive electrode trace 11 and a negative electrode trace 12 respectively formed on the substrate body 10 (S100). The substrate unit 1 can be a PCB (Printed Circuit Board), a flexible substrate, an aluminum substrate, a ceramic substrate, or a copper substrate. In addition, both the positive electrode trace 11 and the negative electrode trace 12 can be aluminum circuits or silver circuits. The layouts of the positive electrode trace 11 and the negative electrode trace 12 are determined by different needs.

Figure 1:
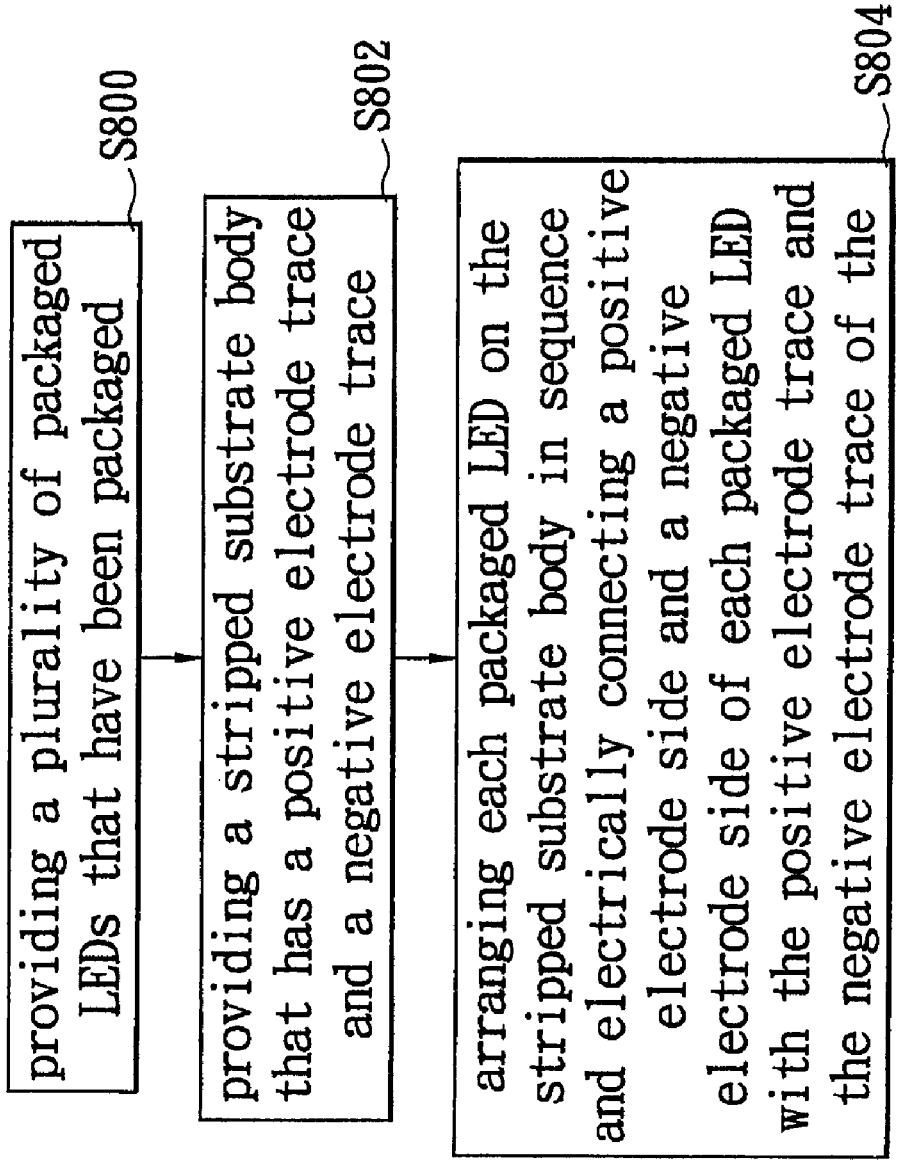
FIG. 1 is a flowchart of a first method for packaging LED chips of prior art.
Figure 2:
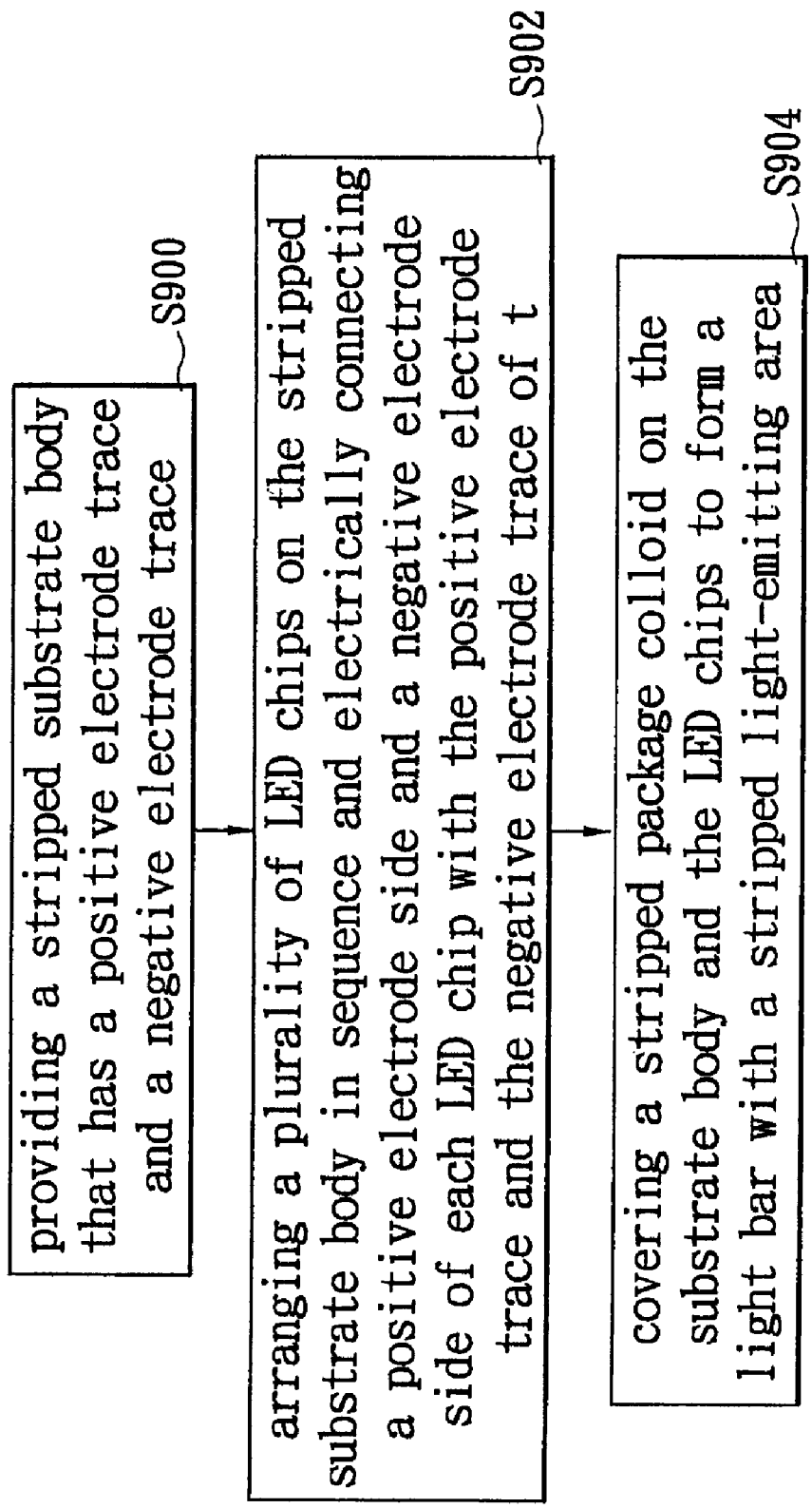
FIG. 2 is a flowchart of a second method for packaging LED chips of prior art.
Figure 3:
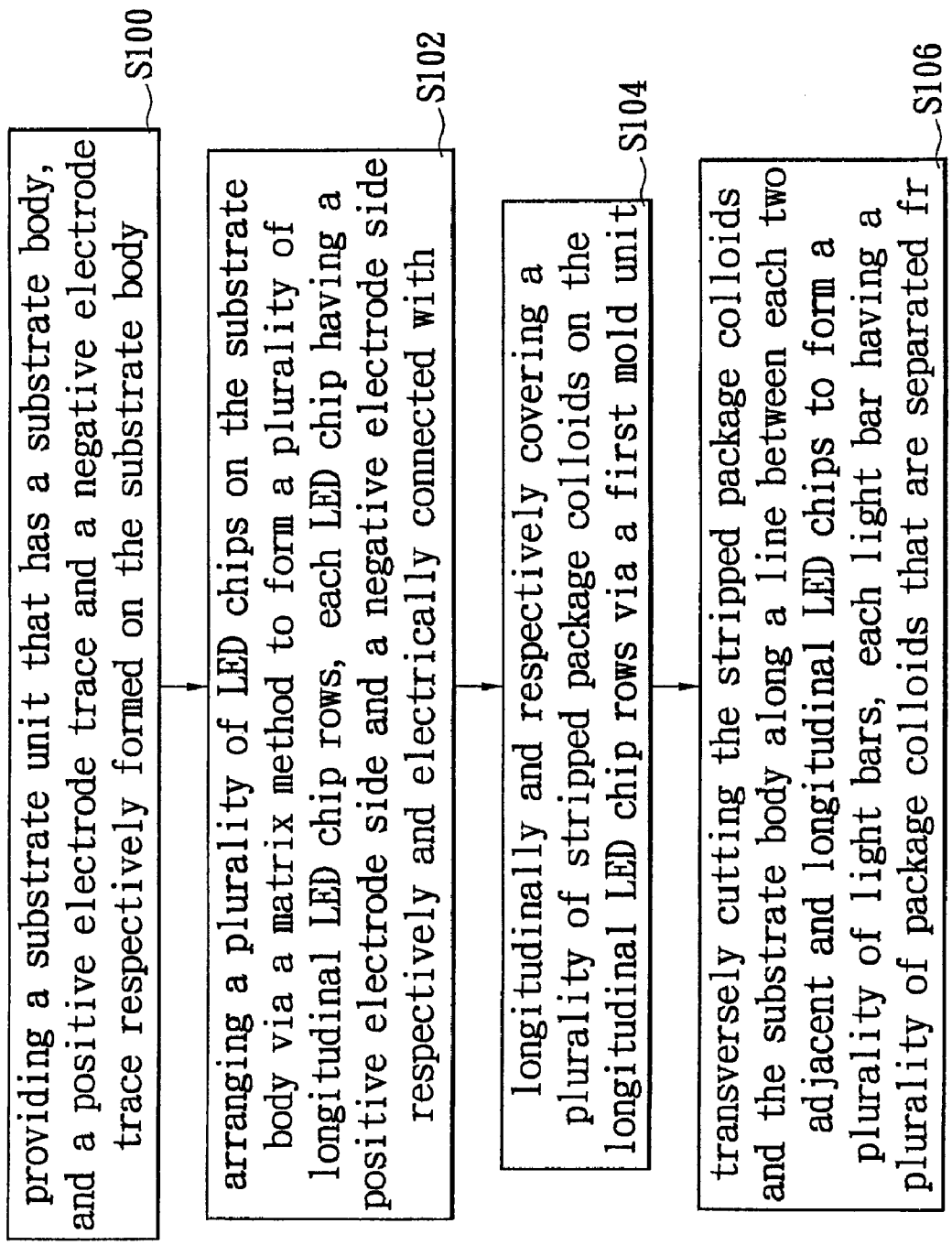
FIG. 3 is a flowchart of a method of packaging LED chips package structure according to the first embodiment of present invention.
Figure 3B:
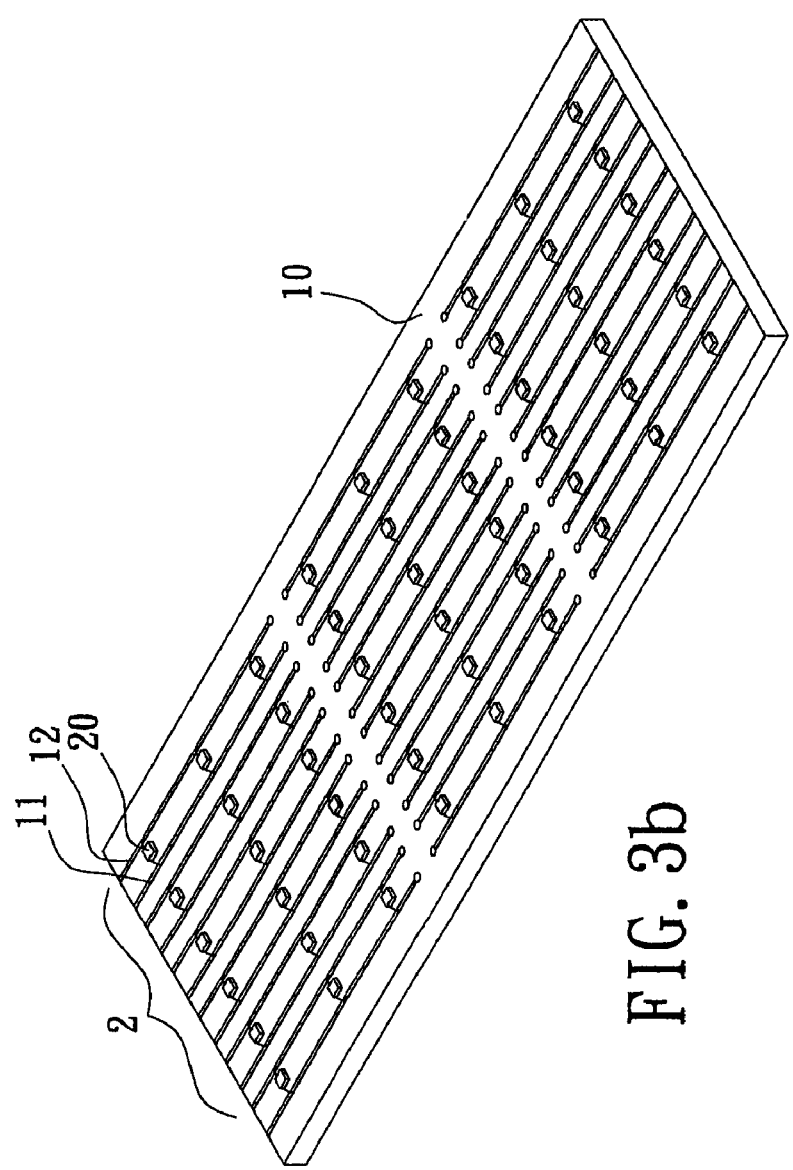
Figure 3B:
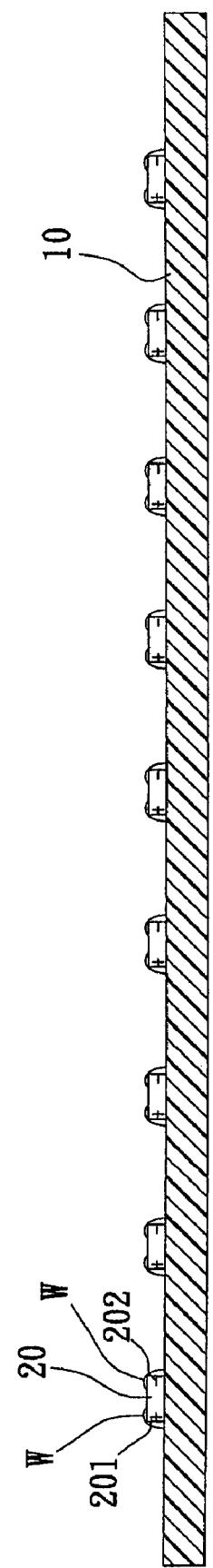

Referring to FIGS. 3b and 3B, the method of the first embodiment further comprises: arranging a plurality of LED chips 20 on the substrate body 10 via a matrix method to form a plurality of longitudinal LED chip rows 2, each LED chip 20 having a positive electrode side 201 and a negative electrode side 202 respectively and electrically connected with the positive electrode trace 11 and the negative electrode trace 12 of the substrate unit 1 (S102).

In the first embodiment, the positive electrode side 201 and the negative electrode side 202 of each LED chip 20 are respectively and electrically connected with the positive electrode trace 11 and the negative electrode trace 12 of the substrate unit 1 via two corresponding leading wires W via a wire-bounding method. Moreover, each longitudinal LED chip row 2 is straightly arranged on the substrate body 10 of the substrate unit 1. Each LED chip 20 can be a blue LED chip.

Figure 4:
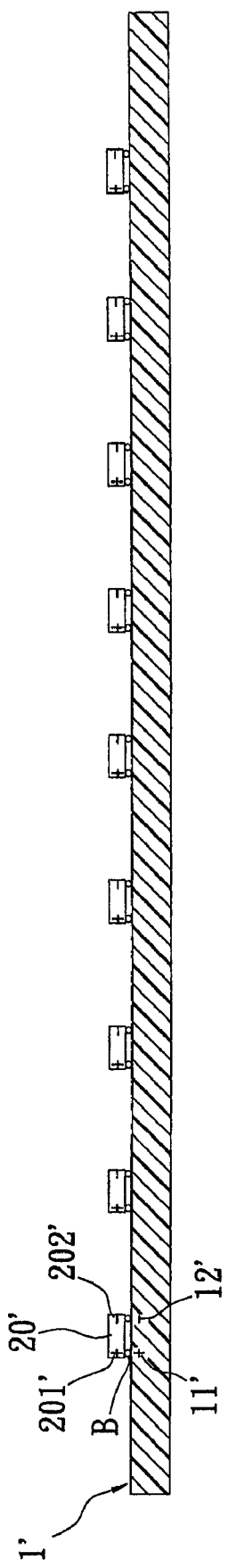
FIG. 4 is a schematic view of LED chips electrically connected on a substrate body via a flip-chip method.

However, the above-mentioned method of electrically connecting the LED chips should not be used to limit the present invention. For example, referring to FIG. 4, the positive electrode side 201' and the negative electrode side 202' of each LED chip 20' respectively and electrically connected with the positive electrode trace 11' and the negative electrode trace 12' of the substrate unit 1' via a plurality of corresponding solder balls B via a flip-chip method. Moreover, according to different needs, positive electrode sides and negative electrode sides of LED chips (not shown) can be electrically connected to a positive electrode trace and a negative electrode trace of a substrate unit (not shown) via parallel, serial, or parallel and serial method.

Referring to FIGS. 3c and 3C, the method of the first embodiment further comprises: longitudinally and respectively covering a plurality of stripped package colloids 3 on the longitudinal LED chip rows 2 via a first mold unit M1 (S104).

The first mold unit M1 is composed of a first upper mold M11 and a first lower mold M12 for supporting the substrate body 10. The first upper mold M11 has a plurality of first channels M110 corresponding to the longitudinal LED chip rows 2.

Each first channel M110 has a height and a width the same as those of each stripped package colloid 3. Moreover, according to a user's needs, each stripped package colloid 3 can be a fluorescent resin that is formed by mixing silicon and fluorescent powders, or each stripped package colloid 3 can be a fluorescent resin that is formed by mixing epoxy and fluorescent powders.

Figure 3D:
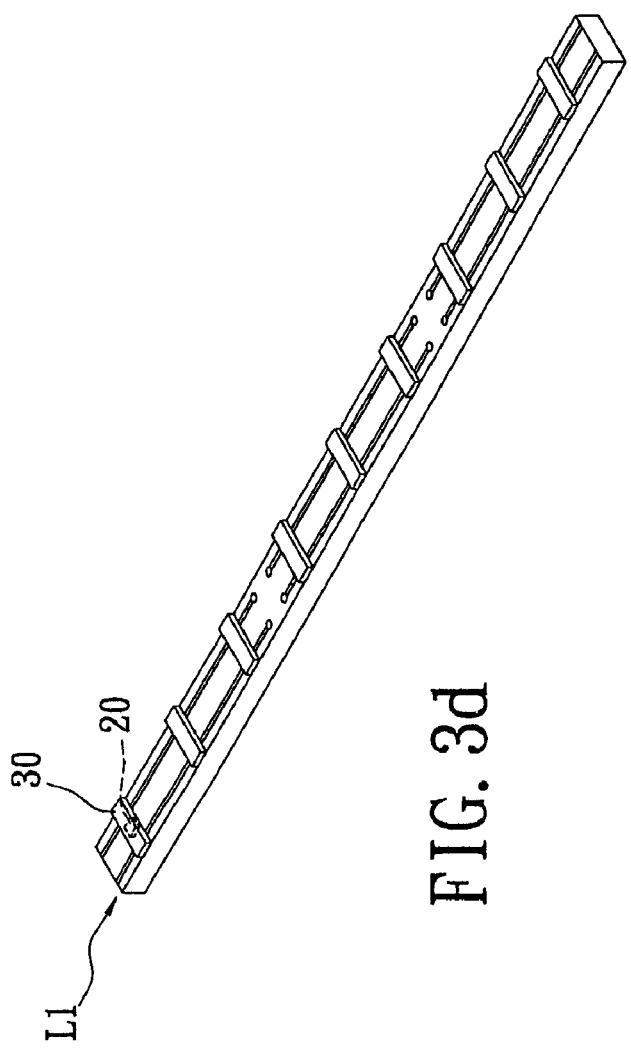
Figure 3D:
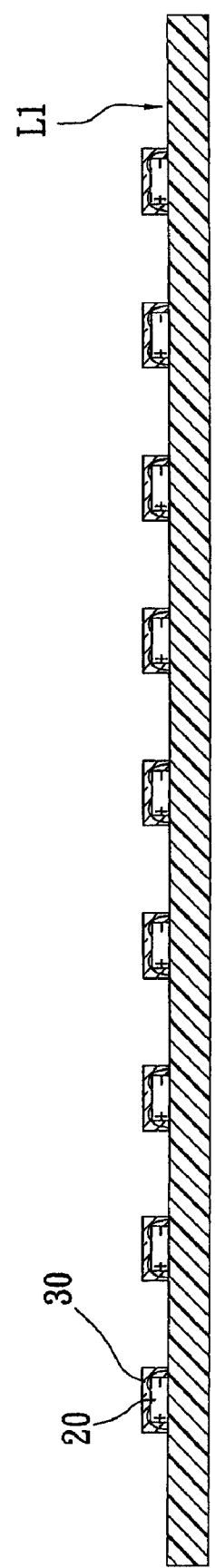

Finally, referring to FIGS. 3c, 3d, and 3D, the method of the first embodiment further comprises: transversely cutting the stripped package colloids 3 and the substrate body 10 along a line between each two adjacent and longitudinal LED chips 20 to form a plurality of light bars L1, each light bar L1 having a plurality of package colloids 30 that are separated from each other and respectively covered on the corresponding LED chips 20 (S106).

Figure 5:
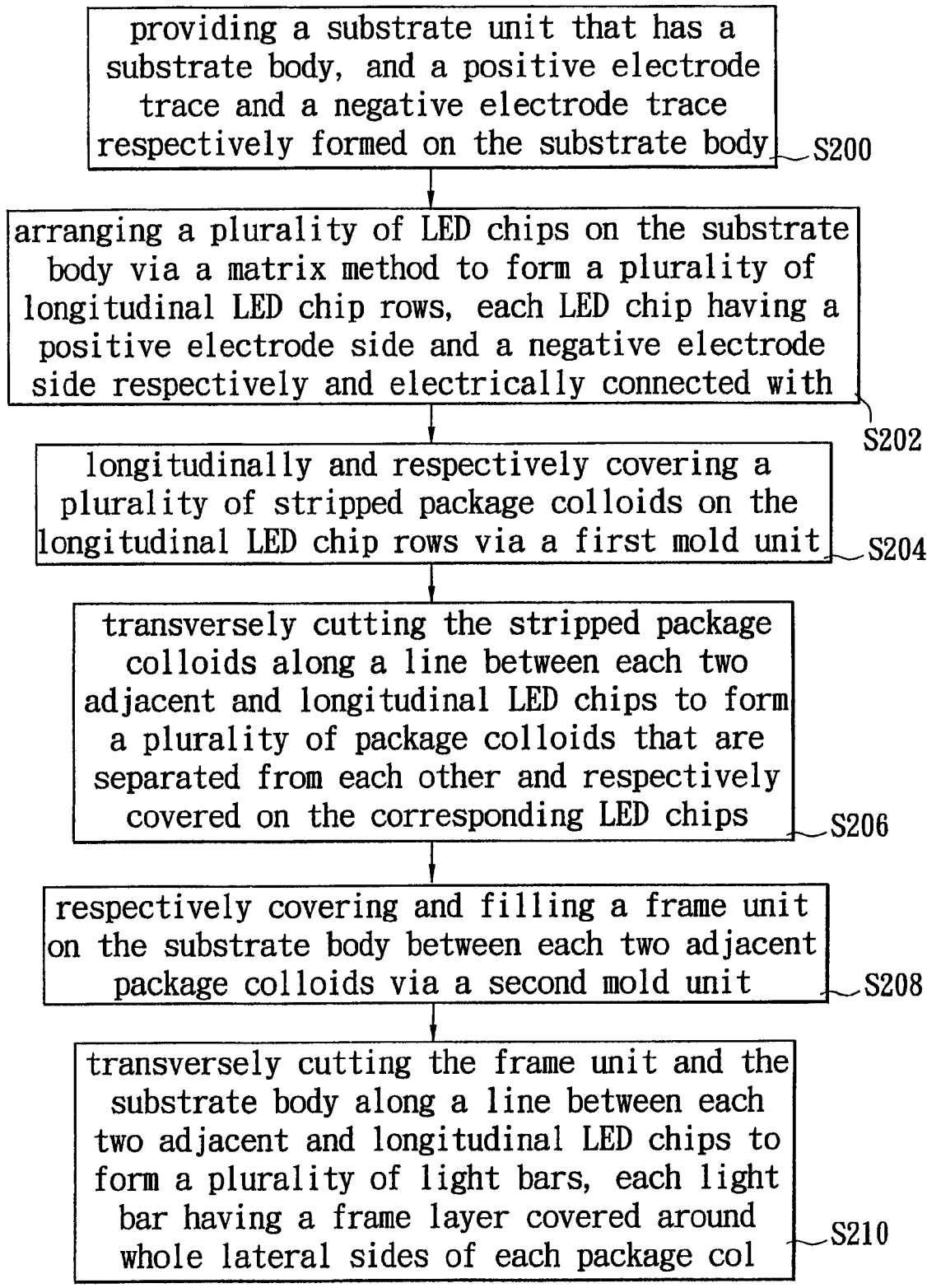
FIG. 5 is a flowchart of a method of packaging LED chips package structure according to the second embodiment of present invention.

Referring to FIGS. 5, 5a to 5c, and 5A to 5C, the second embodiment of the present invention provides a method of packaging LED chips package structure with high-efficiency light-emitting effect. Referring to FIGS. 3 and 5, the steps S200 to S204 of the second embodiment are same as the steps S100 to S104 of the first embodiment. In other words, the illustration of S200 is the same as FIGS. 3a and 3A of the first embodiment, the illustration of S202 is the same as FIGS. 3b and 3B of the first embodiment, and the illustration of S204 is the same as FIGS. 3c and 3C of the first embodiment.

Figure 5A:
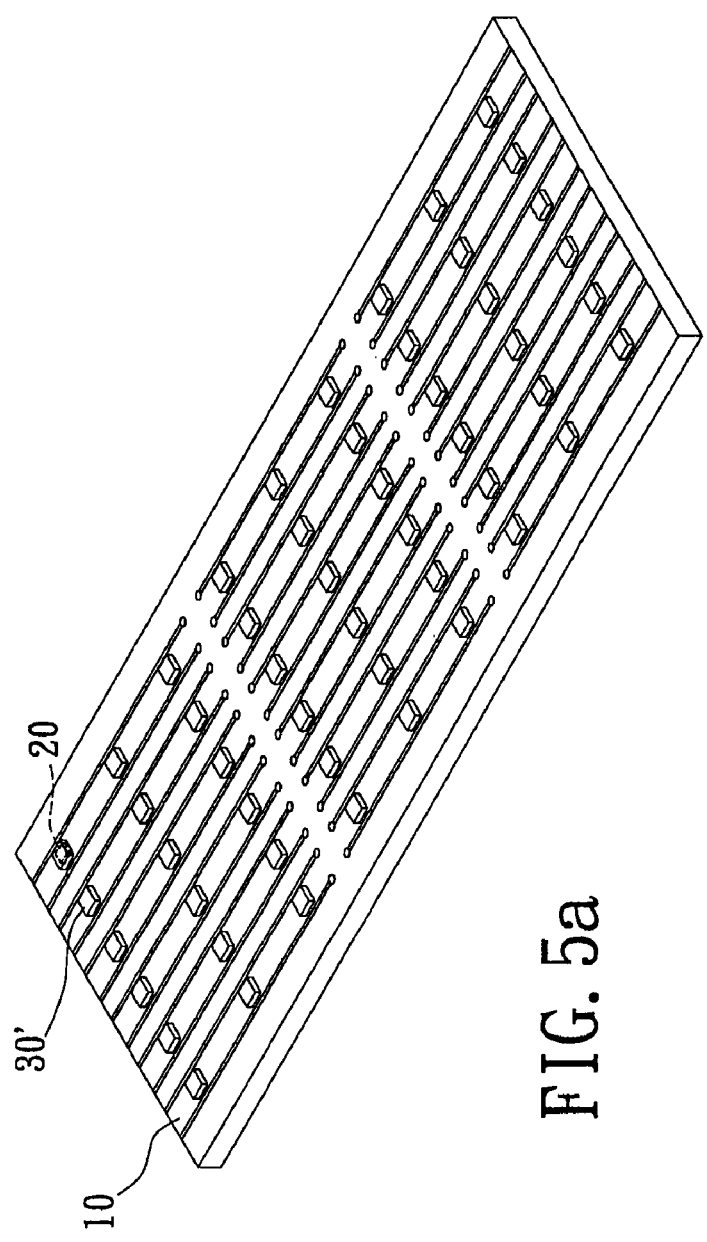
Figure 5A:
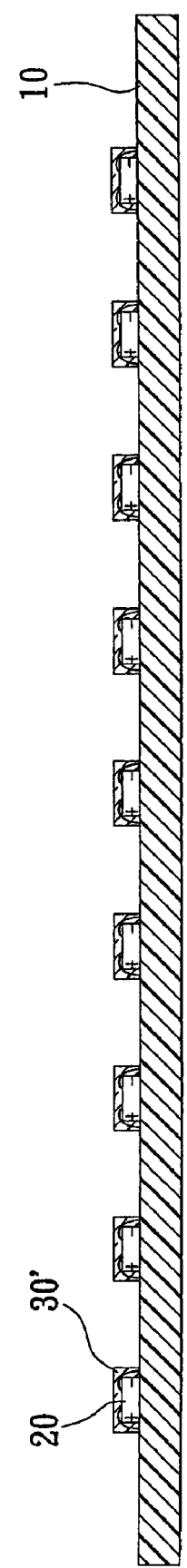

After the step of S204, referring to FIGS. 5a and 5A, the method of the second embodiment further comprises: transversely cutting the stripped package colloids 3 along a line between each two adjacent and longitudinal LED chips 20 to form a plurality of package colloids 30' that are separated from each other and respectively covered on the corresponding LED chips 20 (S206).

Figure 5B:
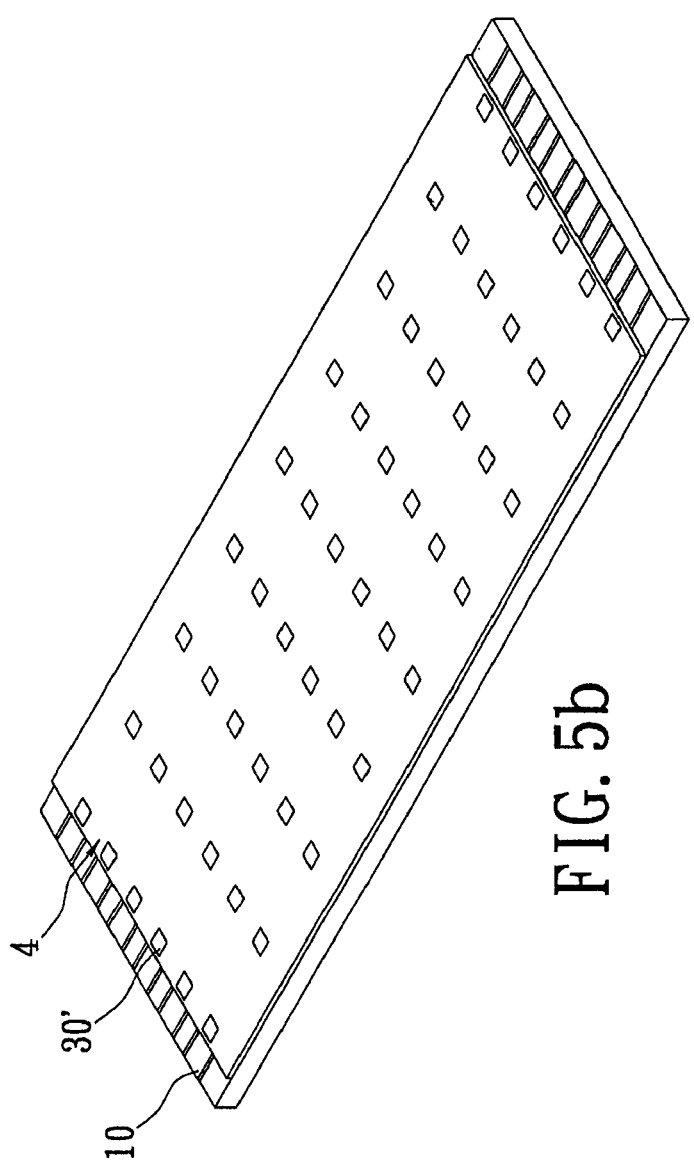
Figure 5B:
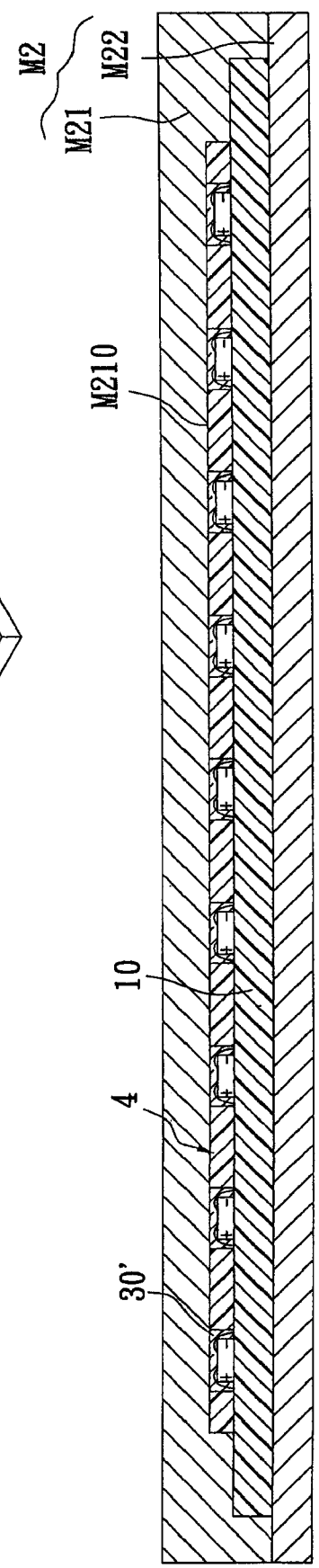

Referring to FIGS. 5b and 5B, the method of the second embodiment further comprises: respectively covering and filling a frame unit 4 on the substrate body 10 between each two adjacent package colloids 30' via a second mold unit M2 (S208). Moreover, the second mold unit M2 is composed of a second upper mold M21 and a second lower mold M22 for supporting the substrate body 10. The second upper mold M21 has a second channel M210 corresponding to the frame unit 4. The second channel M210 has a height the same as that of each package colloid 30' and the second channel M210 has a width the same as that of the frame unit 4.

Finally, referring to FIGS. 5b, 5c, and 5C, the method of the second embodiment further comprises: transversely cutting the frame unit 4 and the substrate body 10 along a line between each two adjacent and longitudinal LED chips 20 to form a plurality of light bars L2, each light bar L2 having a frame layer 40 covered around whole lateral sides of each package colloid 30' (S210). Moreover, the frame layer 40 can be an opaque frame layer such as a white frame layer.

Figure 6:
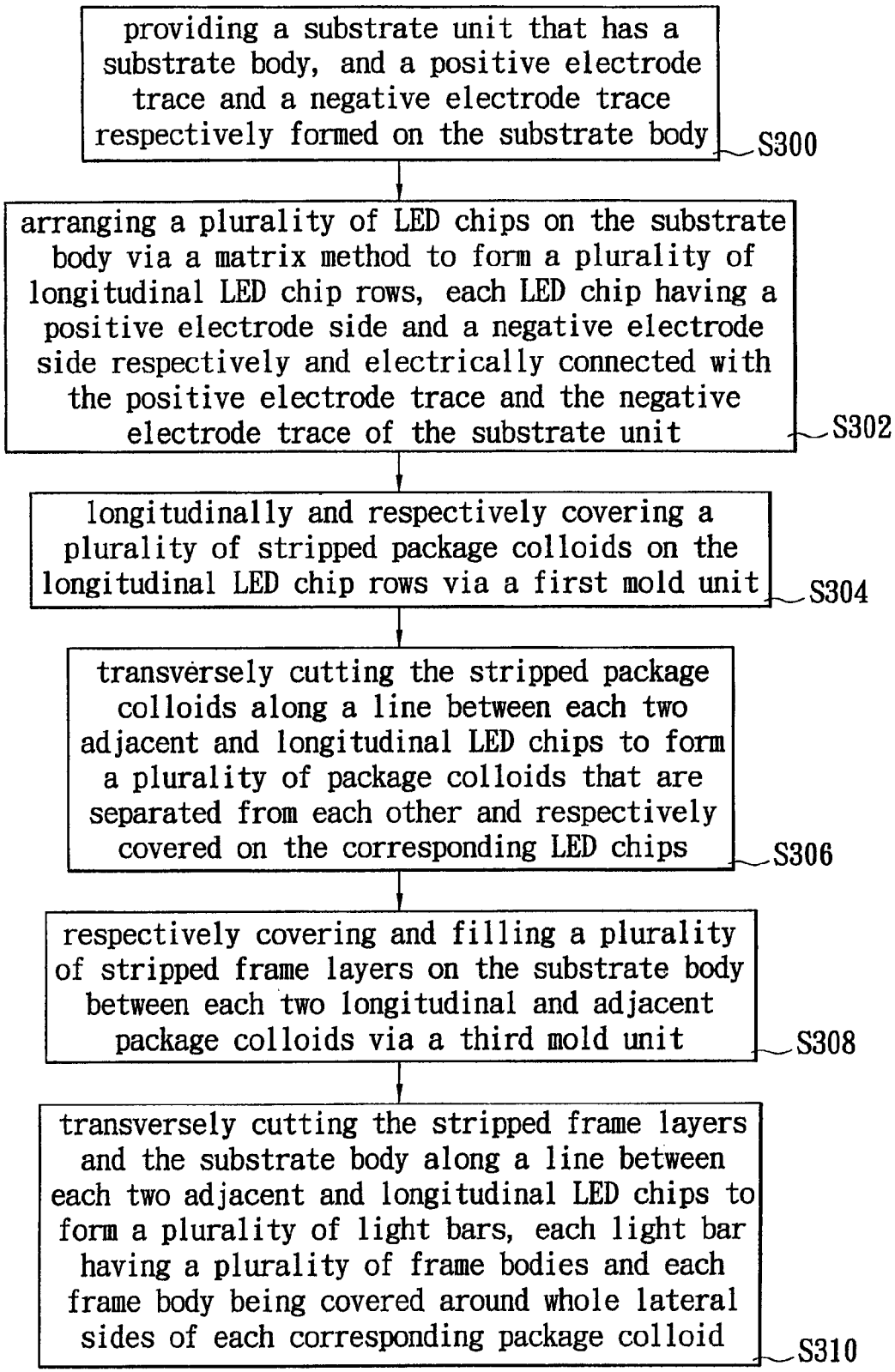
FIG. 6 is a flowchart of a method of packaging LED chips package structure according to the third embodiment of present invention.
Figure 6A:
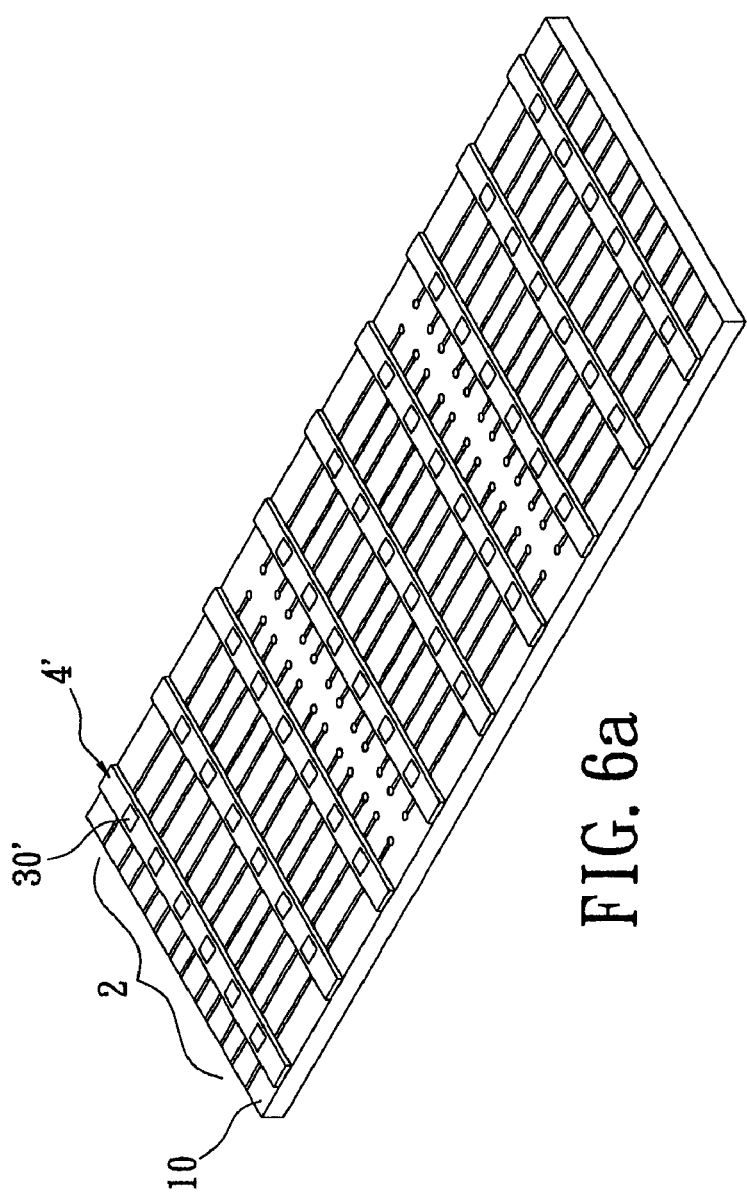
FIGS. 6a to 6b are perspective, schematic diagrams of a packaging process according to the third embodiment of present invention.
Figure 6A:
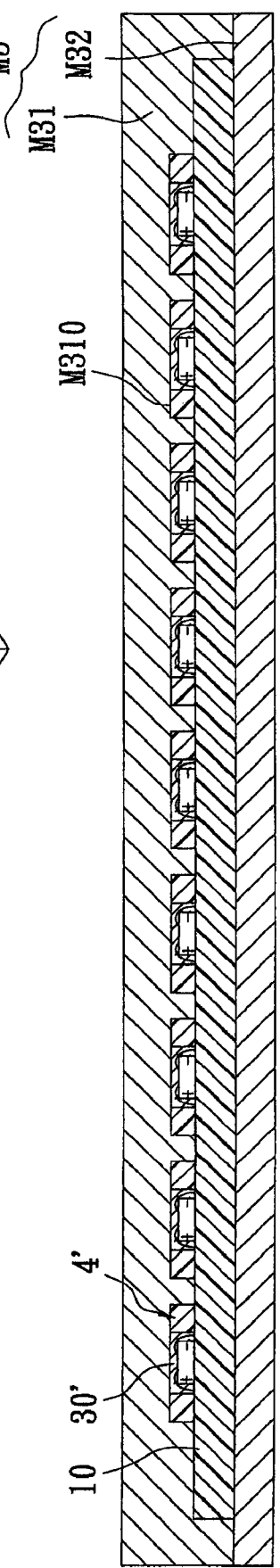
Figure 6B:
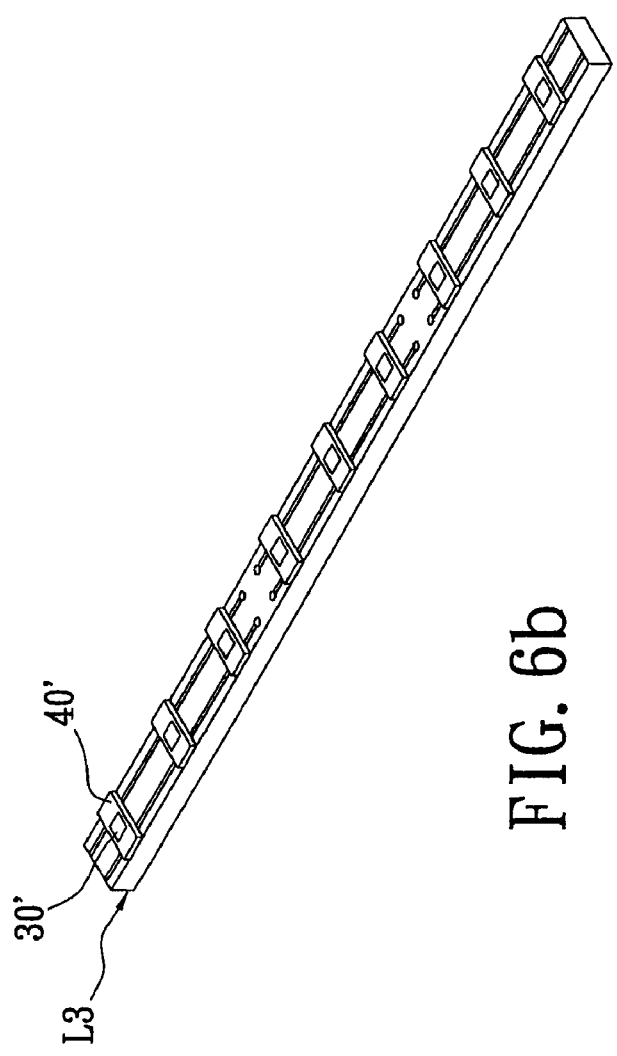
Figure 6B:
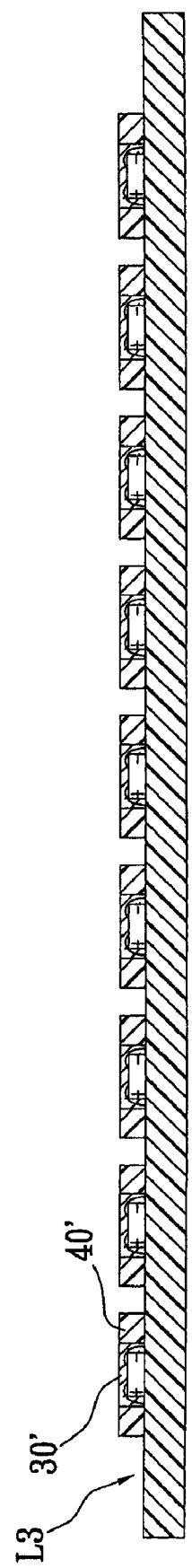

Referring to FIGS. 6, 6a to 6b, and 6A to 6B, the third embodiment of the present invention provides a method of packaging LED chips package structure with high-efficiency light-emitting effect. Referring to FIGS. 3, 5, and 6, the steps S300 to S304 of the third embodiment are same as the steps S100 to S104 of the first embodiment, and the step of S306 of the third embodiment is same as the step of S206 of the second embodiment. In other words, the illustration of S300 is the same as FIGS. 3a and 3A of the first embodiment, the illustration of S302 is the same as FIGS. 3b and 3B of the first embodiment, the illustration of S304 is the same as FIGS. 3c and 3C of the first embodiment, and the illustration of S306 is the same as FIGS. 5a and 5A of the second embodiment.

After the step of S306, referring to FIGS. 6a and 6A, the method of the third embodiment further comprises: respectively covering and filling a plurality of stripped frame layers 4' on the substrate body 10 between each two longitudinal and adjacent package colloids 30' via a third mold unit M3 (S308).

The third mold unit M3 is composed of a third upper mold M31 and a third lower mold M32 for supporting the substrate body 10. The third upper mold M31 has a plurality of third channels M310 corresponding to the longitudinal LED chip rows 2. Each third channel M310 has a height the same as that of each corresponding package colloid 30' and each third channel M310 has a width larger than that of each corresponding package colloid 30'.

Finally, referring to FIGS. 6a, 6b, and 6B, the method of the third embodiment further comprises: transversely cutting the stripped frame layers 4' and the substrate body 10 along a line between each two adjacent and longitudinal LED chips 20 to form a plurality of light bars L3, each light bar L3 having a plurality of frame bodies 40' and each frame body 40' being covered around whole lateral sides of each corresponding package colloid 30' (S310). Moreover, each frame layer 40' can be an opaque frame body such as a white frame body.

In conclusion, when the LED chip package structure of the present invention lights up, the LED chip package structure generates a series of light-generating areas on a colloid unit. Because the series of light-generating areas is continuous, no dark bands are produced between each two LED chips. Furthermore, because the LED chips are arranged on a substrate body via an adhesive or a hot pressing method, the process of the LED chip package structure is simple and therefore reduces the required manufacturing time. Furthermore, the LED chip package structure can be applied to any type of light source such as a back light module, a decorative lamp, a lighting lamp, or a scanner.

Although the present invention has been described with reference to the preferred best molds thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An LED chip package structure, comprising:
   a substrate unit having a substrate body having a positive electrode trace and a negative electrode trace respectively formed thereon;
   a light-emitting unit having a plurality of LED chips arranged on the substrate body, wherein each LED chip has a positive electrode side and a negative electrode side respectively and electrically connected with the positive electrode trace and the negative electrode trace of the substrate unit;
   a package resin unit having a plurality of package resins separated from each other and respectively covering the LED chips, wherein each package resin has a top surface above each LED chip and a peripheral surface around each LED chip; and
   a frame unit having a continuous opaque frame layer disposed on the substrate body for covering and contacting the peripheral surface of each package resin, wherein the top surface of each package resin is exposed from the continuous opaque frame layer.

2. The LED chip package structure as claimed in claim 1, wherein the substrate unit is a PCB (Printed Circuit Board), a flexible substrate, an aluminum substrate, a ceramic substrate, or a copper substrate.

3. The LED chip package structure as claimed in claim 1, wherein both the positive electrode trace and the negative electrode trace are aluminum circuits or silver circuits.

4. The LED chip package structure as claimed in claim 1, wherein the positive electrode side and the negative electrode side of each LED chip are respectively and electrically connected with the positive electrode trace and the negative electrode trace of the substrate unit via two corresponding leading wires via a wire-bounding method.

5. The LED chip package structure as claimed in claim 1, wherein the positive electrode side and the negative electrode side of each LED chip are respectively and electrically connected with the positive electrode trace and the negative electrode trace of the substrate unit via a plurality of corresponding solder balls via a flip-chip method.

6. The LED chip package structure as claimed in claim 1, wherein the LED chips are straightly arranged on the substrate body of the substrate unit along a straight line.

7. The LED chip package structure as claimed in claim 1, wherein the LED chips are straightly arranged on the substrate body of the substrate unit along a plurality of straight lines.

8. The LED chip package structure as claimed in claim 1, wherein each package resin is a fluorescent resin that is formed by mixing silicon and fluorescent powders.

9. The LED chip package structure as claimed in claim 1, wherein each package resin is a fluorescent resin that is formed by mixing epoxy and fluorescent powders.

10. An LED chip package structure with high-efficiency light-emitting effect, comprising:
- a substrate unit having a substrate body having a positive electrode trace and a negative electrode trace respectively formed thereon;
- a light-emitting unit having a plurality of LED chips arranged on the substrate body, wherein each LED chip has a positive electrode side and a negative electrode side respectively and electrically connected with the positive electrode trace and the negative electrode trace of the substrate unit;
- a package resin unit having a plurality of package resins separated from each other and respectively covering the LED chips, wherein each package resin has a top surface above each LED chip and a peripheral surface around each LED chip; and
- a frame unit having a plurality of opaque frame bodies separated from each other, wherein each opaque frame body is disposed on the substrate body for covering and contacting the peripheral surface of each package resin, and the top surface of each package resin is exposed from each opaque frame body.

* * * * *